(12) United States Patent
Hayashi

(10) Patent No.: US 11,927,869 B2
(45) Date of Patent: Mar. 12, 2024

(54) SEMICONDUCTOR SUBSTRATE AND A DISPLAY DEVICE INCORPORATING THE SEMICONDUCTOR SUBSTRATE

(71) Applicant: Japan Display Inc., Tokyo (JP)

(72) Inventor: Hirotaka Hayashi, Tokyo (JP)

(73) Assignee: Japan Display Inc., Tokyo (JP)

(*) Notice: Subject to any disclaimer, the term of this patent is extended or adjusted under 35 U.S.C. 154(b) by 205 days.

(21) Appl. No.: 17/451,339

(22) Filed: Oct. 19, 2021

(65) Prior Publication Data

US 2022/0128881 A1 Apr. 28, 2022

(30) Foreign Application Priority Data

Oct. 26, 2020 (JP) ................. 2020-179100

(51) Int. Cl.
| | |
|---|---|
| *G02F 1/16766* | (2019.01) |
| *G02F 1/1333* | (2006.01) |
| *G02F 1/1362* | (2006.01) |
| *G02F 1/167* | (2019.01) |
| *G02F 1/16757* | (2019.01) |
| *H01L 27/12* | (2006.01) |
| *H01L 29/786* | (2006.01) |

(52) U.S. Cl.
CPC .... *G02F 1/16766* (2019.01); *G02F 1/133345* (2013.01); *G02F 1/136227* (2013.01); *G02F 1/167* (2013.01); *G02F 1/16757* (2019.01); *H01L 27/1225* (2013.01); *H01L 27/124* (2013.01); *H01L 29/7869* (2013.01)

(58) Field of Classification Search
CPC .......... G02F 1/16757; G02F 1/133345; G02F 1/136227; G02F 1/136286
See application file for complete search history.

(56) References Cited

U.S. PATENT DOCUMENTS

2015/0294993 A1* 10/2015 Kim ................. H01L 29/41758
257/43
2020/0251597 A1 8/2020 Ikeda et al.

FOREIGN PATENT DOCUMENTS

| CN | 10-3247644 | * 8/2017 | .......... H01L 27/146 |
|---|---|---|---|
| JP | 2011-221097 A | 11/2011 | |
| JP | 2020-126218 A | 8/2020 | |

* cited by examiner

*Primary Examiner* — Lauren Nguyen
(74) *Attorney, Agent, or Firm* — Maier & Maier, PLLC

(57) ABSTRACT

According to one embodiment, a semiconductor substrate, comprising, a first semiconductor layer and a second semiconductor layer that overlap a scanning line, an insulating layer that covers the first semiconductor layer and the second semiconductor layer, and a signal line, wherein the insulating layer has a first opening including a pair of long sides and a pair of short sides, the long sides of the first opening are parallel to the second direction, and the short sides of the first opening are parallel to the first direction, and the signal line is connected to the first semiconductor layer and the second semiconductor layer via the first opening.

11 Claims, 13 Drawing Sheets

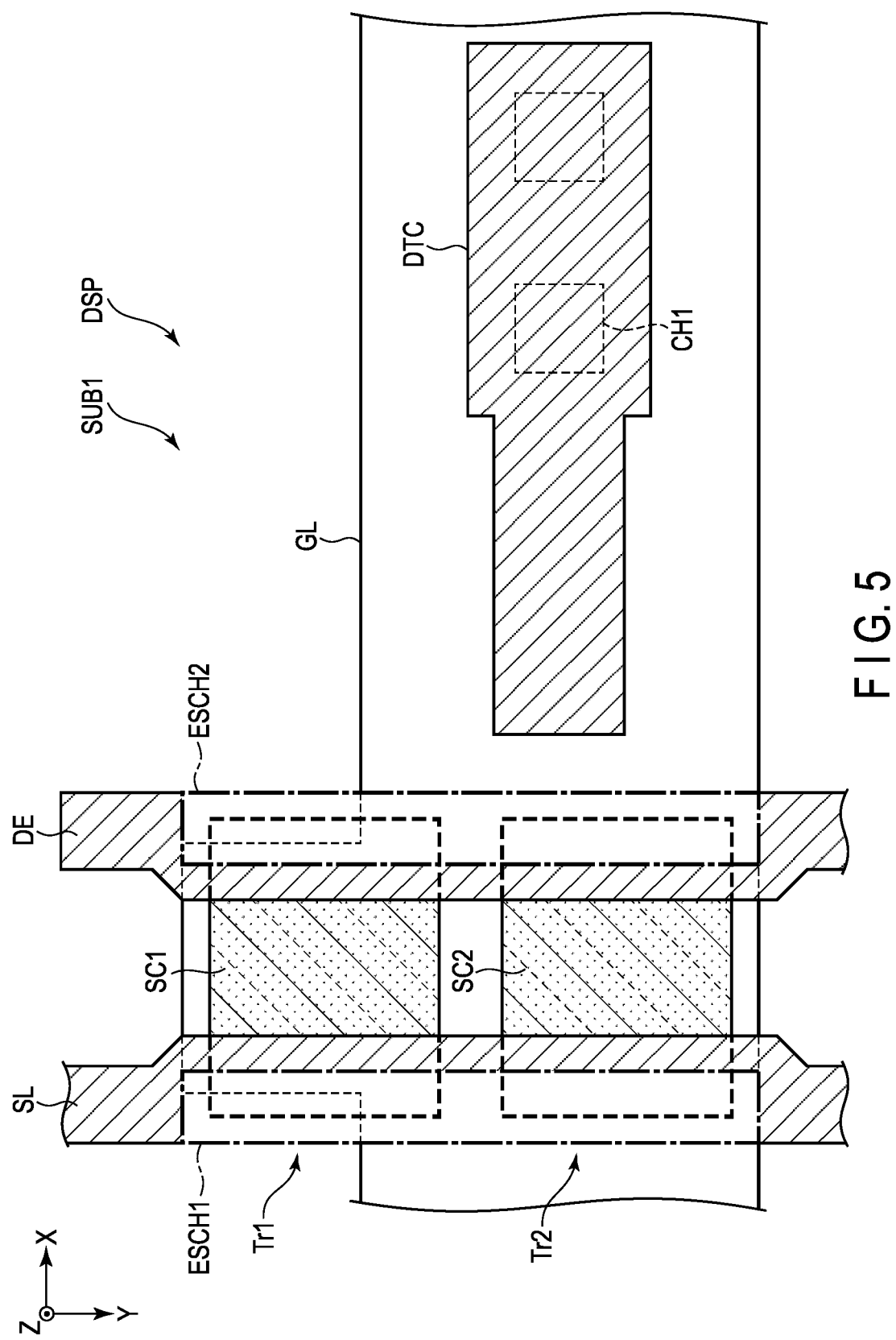
F I G. 5

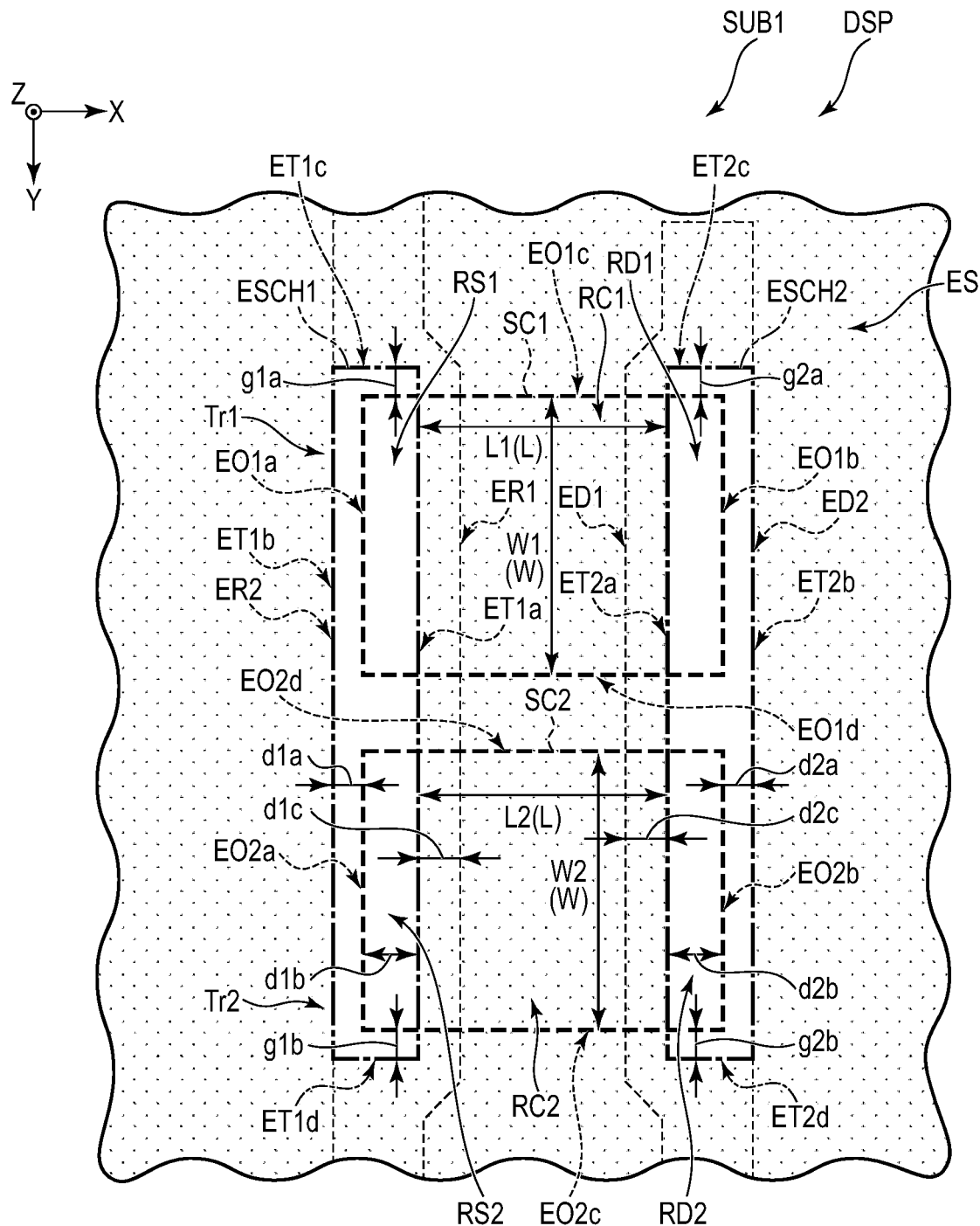
F I G. 6

SEMICONDUCTOR SUBSTRATE AND A DISPLAY DEVICE INCORPORATING THE SEMICONDUCTOR SUBSTRATE

CROSS-REFERENCE TO RELATED APPLICATIONS

This application is based upon and claims the benefit of priority from Japanese Patent Application No. 2020-179100, filed Oct. 26, 2020, the entire contents of which are incorporated herein by reference.

FIELD

Embodiments described herein relate generally to a semiconductor substrate and a display device.

BACKGROUND

As a display device, for example, an electrophoretic display device is known. In such an electrophoretic display device, a thin film transistor is used as a switching element.

BRIEF DESCRIPTION OF THE DRAWINGS

FIG. 5 is a plan view illustrating the scanning line, the semiconductor layers, the openings of the insulating layer, a signal line, and a connection electrode in FIG. 1.

FIG. 6 is a view illustrating the semiconductor layers, the signal line, the connection electrode, the insulating layer, and the openings in FIG. 1.

DETAILED DESCRIPTION

Figure 1:
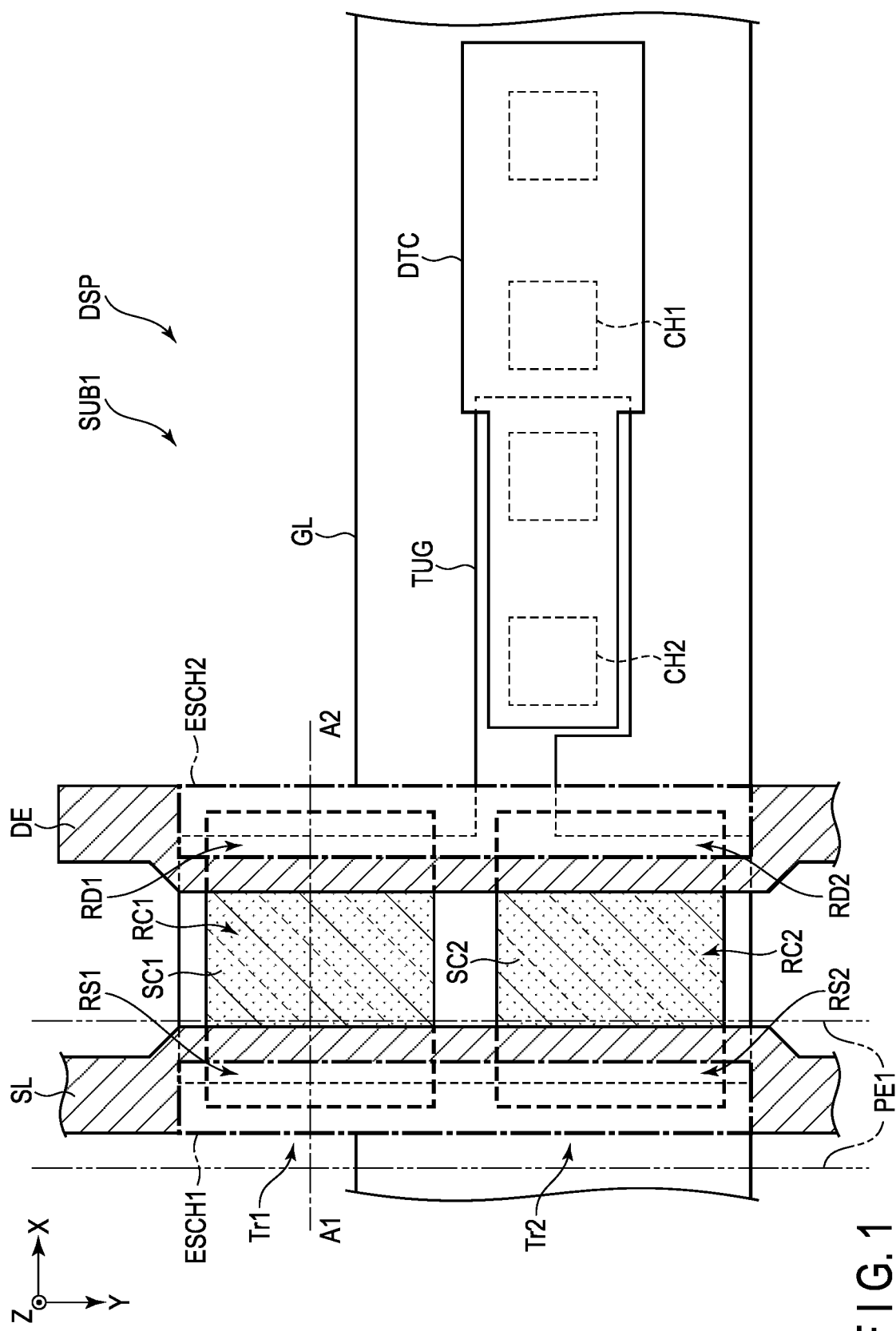
FIG. 1 is a plan view of a semiconductor substrate according to the present embodiment.

In general, according to one embodiment, a semiconductor substrate, comprising, a scanning line that extends in a first direction, a first semiconductor layer and a second semiconductor layer that overlap the scanning line, an insulating layer that covers the first semiconductor layer and the second semiconductor layer, and a signal line that is provided on the insulating layer, intersects the scanning line, and extends in a second direction, wherein the insulating layer has a first opening including a pair of long sides and a pair of short sides, the long sides of the first opening are parallel to the second direction, and the short sides of the first opening are parallel to the first direction, and the signal line is connected to the first semiconductor layer and the second semiconductor layer via the first opening.

According to another embodiment, a semiconductor substrate, comprising, a scanning line that extends in a first direction, a first insulating layer that is provided on the scanning line, an oxide semiconductor layer that overlaps the scanning line on the first insulating layer, a second insulating layer that is provided on the oxide semiconductor layer, a first opening and a second opening that are provided in the second insulating layer, a signal line that is provided on the second insulating layer and extends in a second direction intersecting the first direction, and a connection electrode that is provided on the second insulating layer and extends in the second direction, wherein the signal line is connected to the oxide semiconductor layer via the first opening, the connection electrode is connected to the oxide semiconductor layer via the second opening, the oxide semiconductor layer has a first end portion and a second end portion extending in the second direction, the first opening has a third end portion and a fourth end portion extending in the second direction, the second opening has a fifth end portion and a sixth end portion extending in the second direction, the third end portion and the fifth end portion are opposed to each other and spaced apart from each other in the first direction, the first end portion is located between the third end portion and the fourth end portion in the first direction, and the second end portion is located between the fifth end portion and the sixth end portion in the first direction.

According to another embodiment, a display device, comprising, a semiconductor substrate that includes a first base, a scanning line that is provided on the first base and extends in a first direction, a first insulating layer that is provided on the scanning line, an oxide semiconductor layer that is provided on the scanning line, a second insulating layer that is provided on the oxide semiconductor layer, a first opening and a second opening that are provided in the second insulating layer, a signal line that is provided on the second insulating layer and extends in a second direction intersecting the first direction, a connection electrode that is provided on the second insulating layer and extends in the second direction, and a pixel electrode that is connected to the connection electrode, a counter-substrate that includes a second base opposed to the pixel electrode, and a counter-electrode located between the second base and the pixel electrode and opposed to the pixel electrode; and a display function layer which is located between the pixel electrode and the counter-electrode and to which a voltage applied between the pixel electrode and the counter-electrode is applied, wherein the signal line is connected to the oxide semiconductor layer via the first opening, the connection electrode is connected to the oxide semiconductor layer via the second opening, the oxide semiconductor layer has a first end portion and a second end portion extending in the second direction, the first opening has a third end portion and a fourth end portion extending in the second direction, the second opening has a fifth end portion and a sixth end portion extending in the second direction, the third end portion and the fifth end portion are opposed to each other and spaced apart from each other in the first direction, the first end portion is located between the third end portion and the fourth end portion in the first direction, and the second end portion is located between the fifth end portion and the sixth end portion in the first direction.

According to the present embodiment, it is possible to provide a semiconductor substrate in which occurrence of characteristic non-uniformity is suppressed and which has uniform characteristics, and a display device including the semiconductor substrate.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and a detailed description thereof is omitted unless otherwise necessary.

A semiconductor substrate according to an embodiment will be described hereinafter with reference to the accompanying drawings.

In the following descriptions, for example, a first direction X, a second direction Y and a third direction Z are orthogonal to each other, but may intersect at an angle other than ninety degrees. A direction forwarding a tip of an arrow indicating the third direction Z is referred to as "upward" and a direction forwarding oppositely from the tip of the arrow is referred to as "downward".

With such expressions "a second member above a first member" and "a second member below a first member", the second member may be in contact with the first member or may be remote from the first member. In the latter case, a third member may be interposed between the first member and the second member. On the other hand, with such expressions "a second member on a first member" and "a second member on a first member", the second member is meant to be in contact with the first member.

In addition, it is assumed that there is an observation position to observe the semiconductor substrate on a tip side of an arrow in a third direction Z, and viewing from this observation position toward the X-Y plane defined by the first direction X and the second direction Y is referred to as a planar view. Viewing a cross section of the semiconductor substrate in an X-Z plane defined by the first direction X and the third direction Z or a Y-Z plane defined by the second direction Y and the third direction Z is referred to as a cross-sectional view.

Embodiment

Figure 2:
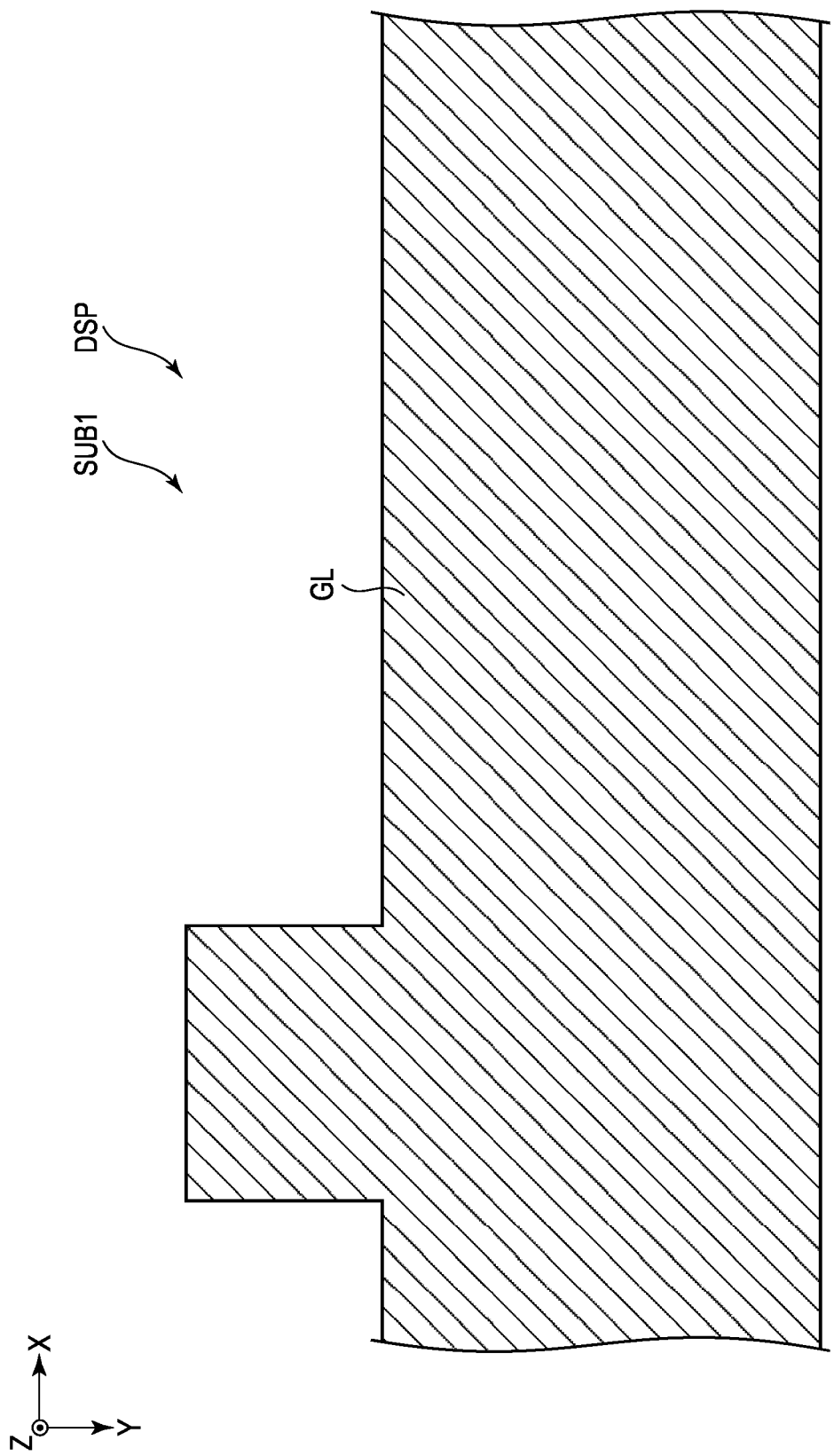
FIG. 2 is a plan view illustrating a scanning line in FIG. 1.
Figure 3:
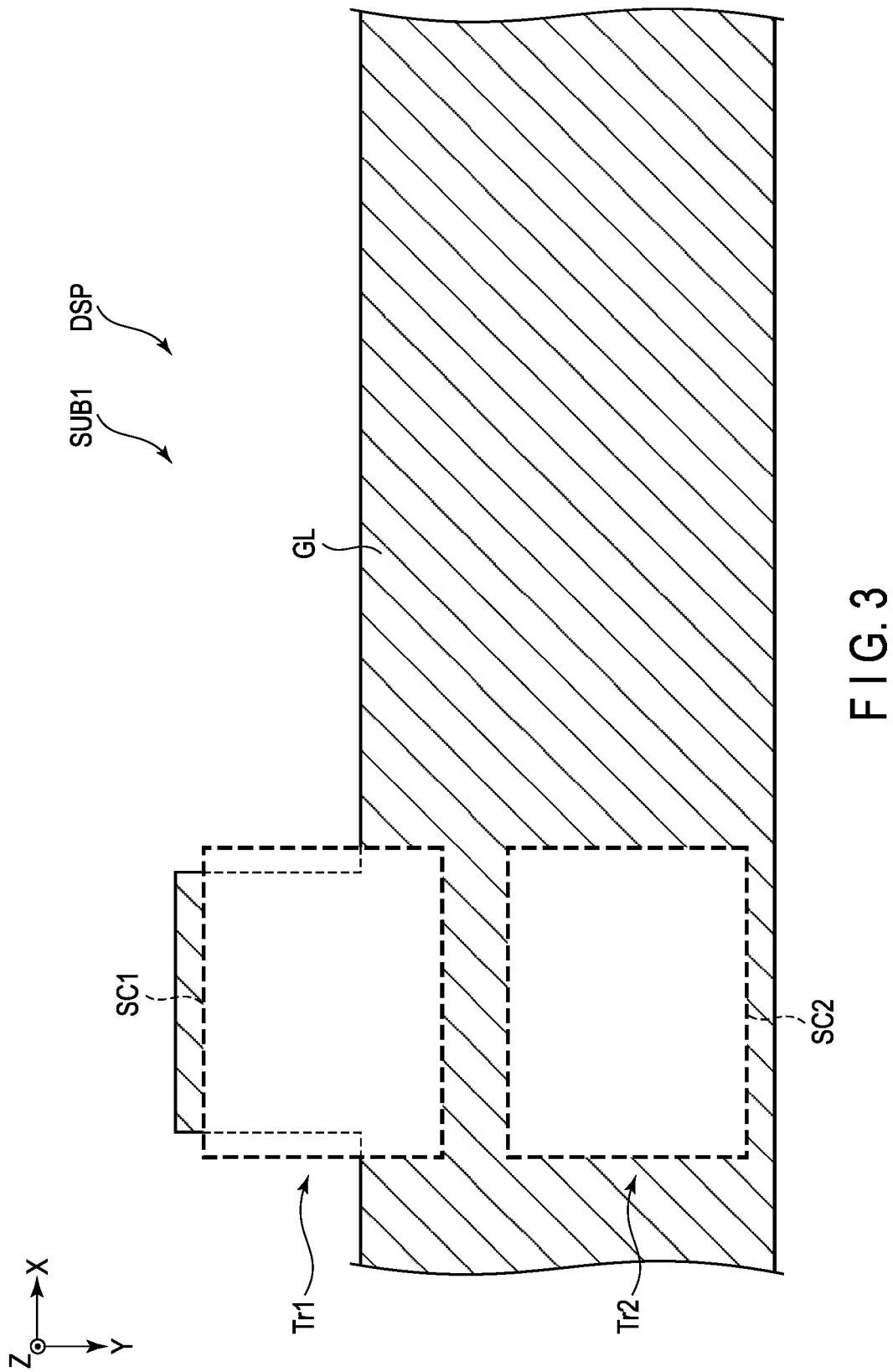
FIG. 3 is a plan view illustrating the scanning line and semiconductor layers in FIG. 1.
Figure 4:
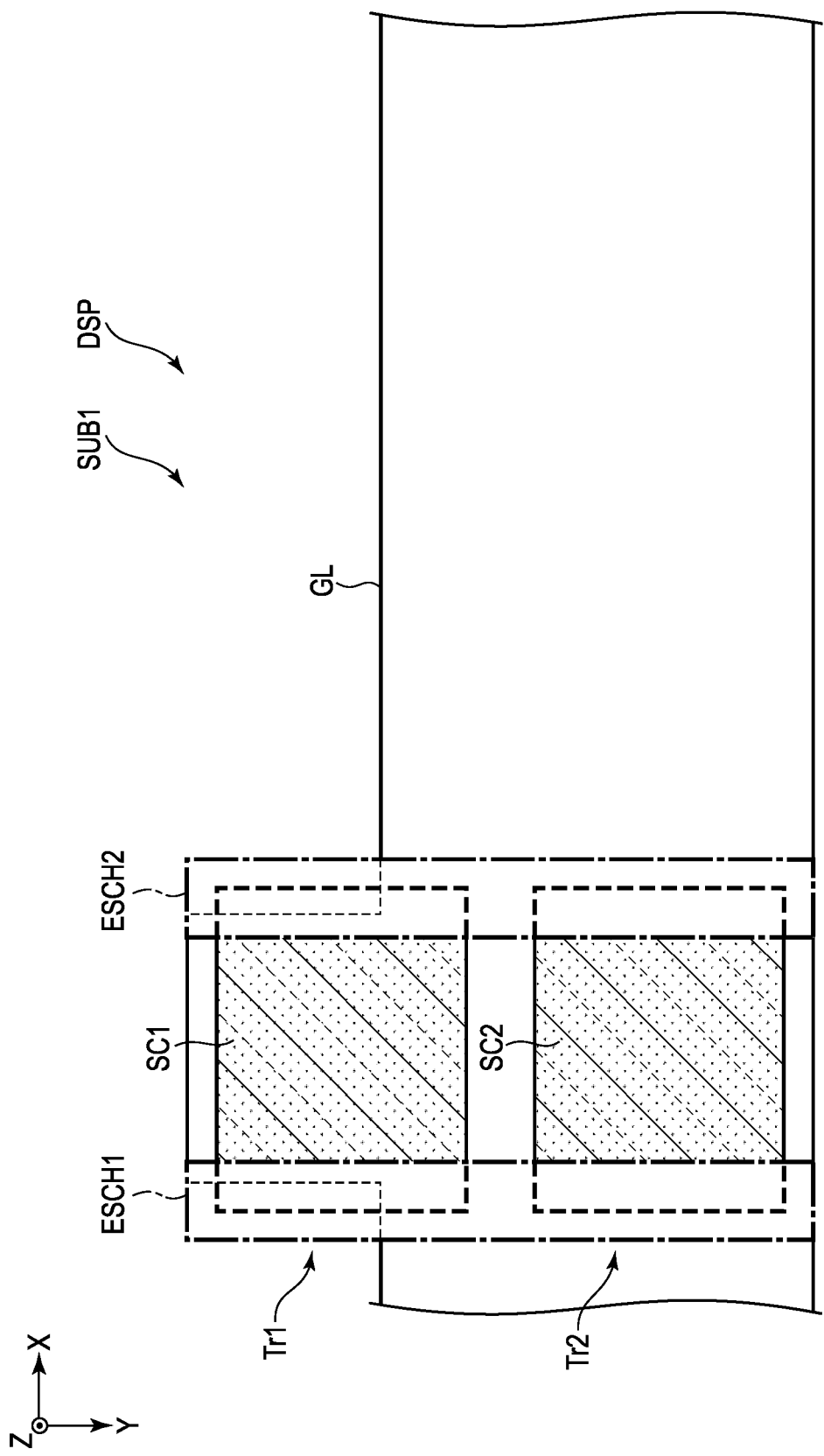
FIG. 4 is a plan view illustrating the scanning line, the semiconductor layers, and openings of an insulating layer in FIG. 1.
Figure 7:
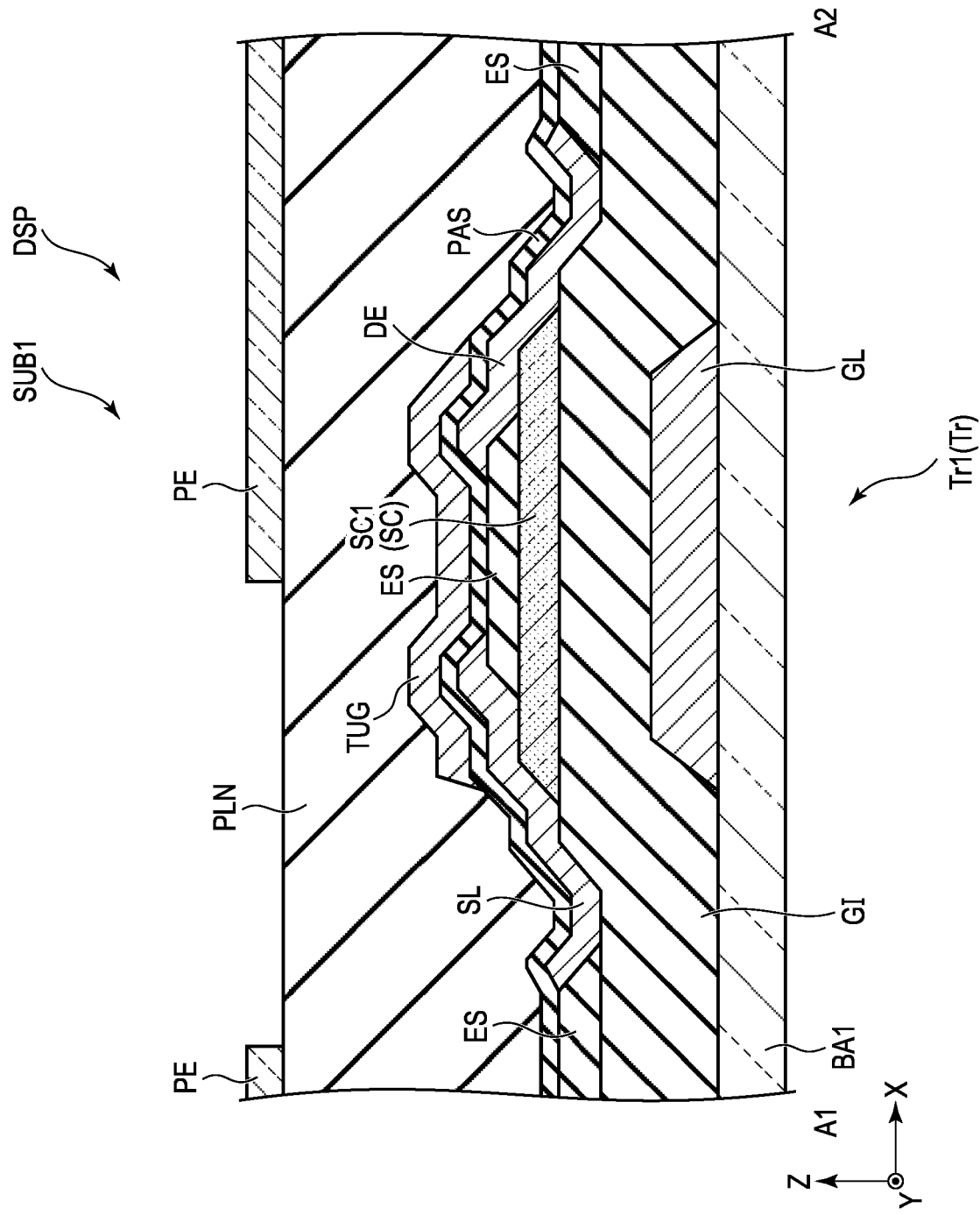
FIG. 7 is a cross-sectional view of the semiconductor substrate taken along a line A1-A2 in FIG. 1.
Figure 8:
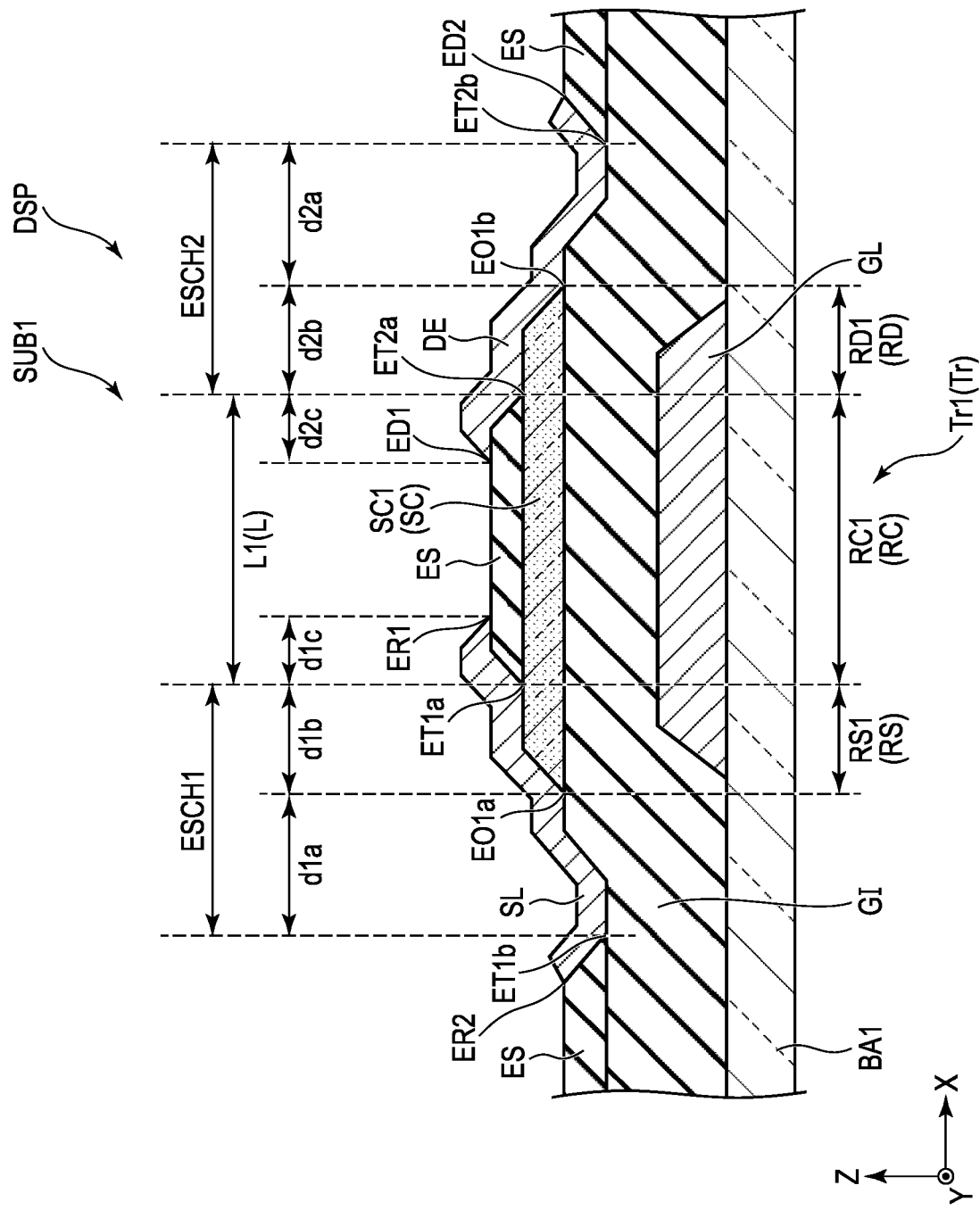
FIG. 8 illustrates only the scanning line, the semiconductor layer, the openings of the insulating layer, the signal line, and the connection electrode in FIG. 7.
Figure 9:
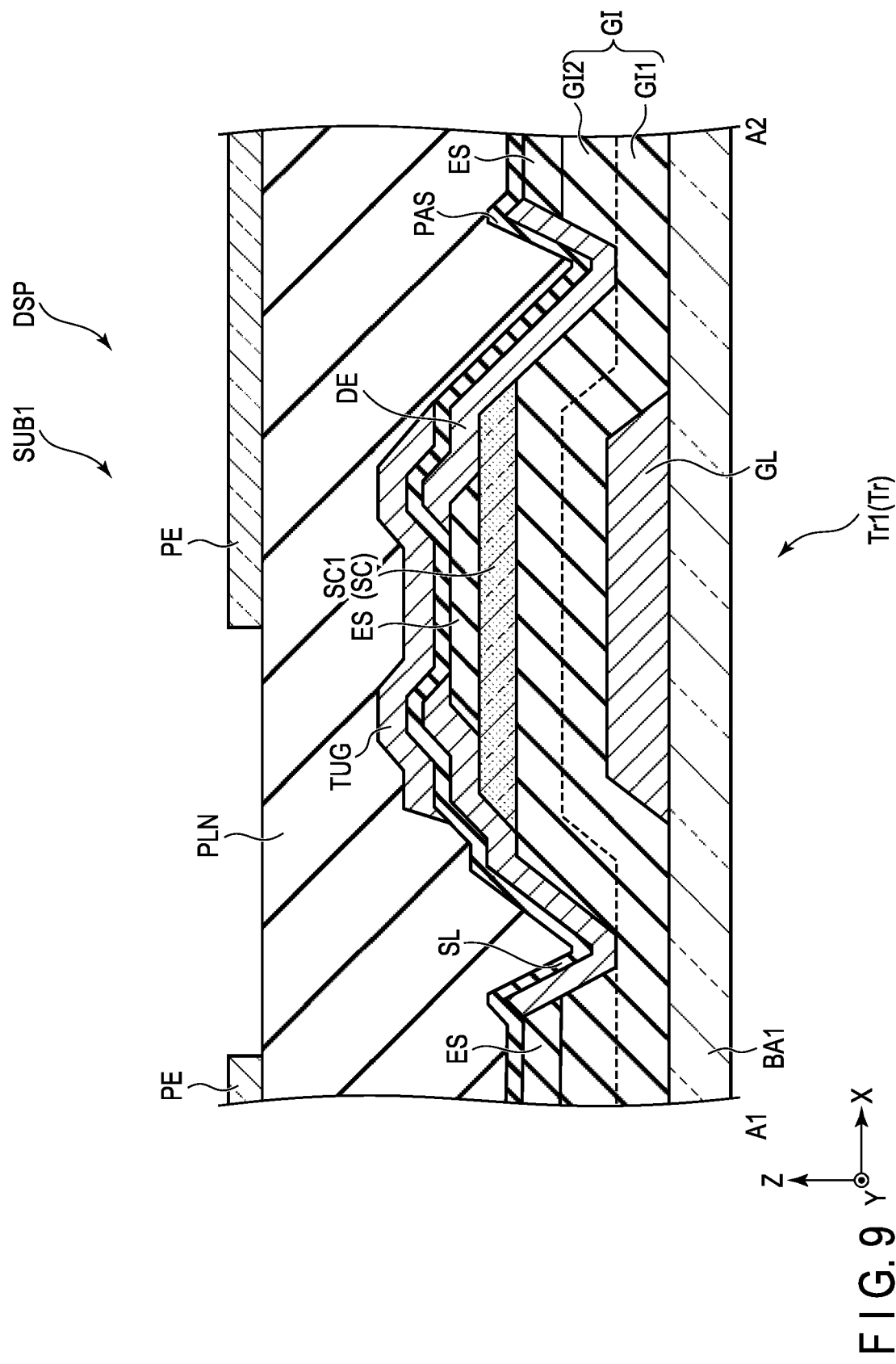
FIG. 9 is a cross-sectional view illustrating another configuration example of FIG. 7.

FIG. 1 is a plan view of a semiconductor substrate according to the present embodiment. FIG. 2 is a plan view illustrating a scanning line in FIG. 1. FIG. 3 is a plan view illustrating the scanning line and semiconductor layers in FIG. 1. FIG. 4 is a plan view illustrating the scanning line, the semiconductor layers, and openings of an insulating layer in FIG. 1. FIG. 5 is a plan view illustrating the scanning line, the semiconductor layers, the openings of the insulating layer, a signal line, and a connection electrode in FIG. 1. FIG. 6 is a view illustrating the semiconductor layers, the signal line, the connection electrode, the insulating layer, and the openings in FIG. 1. FIG. 7 is a cross-sectional view of the semiconductor substrate taken along a line A1-A2 in FIG. 1. FIG. 8 illustrates only the scanning line, the semiconductor layer, the openings of the insulating layer, the signal line, and the connection electrode in FIG. 7. FIG. 9 is a cross-sectional view illustrating another configuration example of FIG. 7. Although details will be described later, a substrate SUB1 illustrated in FIG. 1 is provided in a display device DSP.

In the substrate SUB1 illustrated in FIGS. 1 to 5, the scanning line GL is disposed extending in the first direction X. The signal line SL is disposed extending in the second direction Y. Thin film transistors (TFT) Tr1 and Tr2 (hereinafter, transistors Tr1 and Tr2) are arranged at points of intersection of the scanning line GL and the signal line SL. Note that, in the present embodiment, in a case where it is not necessary to distinguish the transistors Tr1 and Tr2, the transistors Tr1 and Tr2 may be simply referred to as transistor Tr.

The semiconductor layer SC1 of the transistor Tr1 and the semiconductor layer SC2 of the transistor Tr2 each have a long side and a short side, and semiconductor layers having substantially the same shape (substantially the same area) are arranged in parallel to each other. Incidentally, when it is not necessary to distinguish the semiconductor layers SC1 and SC2, the semiconductor layers SC1 and SC2 may be simply referred to as a semiconductor layer SC.

A material used for the semiconductor layers SC1 and SC2 of the present embodiment is an oxide semiconductor. A transistor having such an oxide semiconductor layer (hereinafter, also referred to as an oxide semiconductor transistor) has an extremely small off-leak current. When an oxide semiconductor transistor is used as a switching element in a pixel of a display device, it is possible to hold a charge written in a pixel capacitance for a long time and to keep holding a desired voltage.

Furthermore, the transistor Tr is not limited to the two transistors Tr1 and Tr2 as described above, and may have a structure of three transistors (see FIG. 13 described later) in which a transistor Tri is further added to the transistors Tr1 and Tr2, or may have three or more transistors Tr.

Similarly, the semiconductor layer SC is not limited to the two semiconductor layers SC1 and SC2 as described above, and may have a structure in which three or more semiconductor layers SC be arranged in parallel according to the number of transistors.

The semiconductor layer SC1 of the transistor Tr1 and the semiconductor layer SC2 of the transistor Tr2 have regions RS1 and RS2 in contact with the signal line SL in a planar view, respectively. The semiconductor layer SC1 and the semiconductor layer SC2 have regions RD1 and RD2 in contact with the connection electrode DE (also referred to as a drain electrode) in a planar view, respectively. Each of the regions RS1 and RS2 may be referred to as a source region, and each of the regions RD1 and RD2 may be referred to as a drain region.

The semiconductor layer SC1 has a channel forming region RC1 between the region RS1 and the region RD1, and the semiconductor layer SC2 has a channel forming region RC2 between the region RS2 and the region RD2. The entire channel forming regions RC1 and RC2 of the respective semiconductor layers SC1 and SC2 overlap the same scanning line GL.

In a region where the scanning line GL overlaps the semiconductor layers SC1 and SC2, the scanning line GL covers the semiconductor layers SC1 and SC2. That is, the length along the first direction X in the region is longer than the length of each of the semiconductor layers SC1 and SC2.

The length along the second direction Y in the region is longer than the sum of the lengths of the semiconductor layers SC1 and SC2.

When it is not necessary to particularly distinguish the regions RS1 and RS2 from each other, the regions RS1 and RS2 may be simply referred to as a region RS. When it is not necessary to particularly distinguish the regions RD1 and RD2, the regions RD1 and RD2 may be simply referred to as a region RD. When it is not necessary to particularly distinguish the channel forming regions RC1 and RC2, the regions RC1 and RC2 may be simply referred to as a channel forming region RC.

Although details will be described later, an insulating layer ES is provided on each of the semiconductor layers SC1 and SC2. In the insulating layer ES, an opening ESCH1 is provided so as to overlap the signal line SL, the region RS1 of the semiconductor layer SC1, and the region RS2 of the semiconductor layer SC2. An opening ESCH2 is provided so as to overlap the connection electrode DE, the region RD1 of the semiconductor layer SC1, and the region RD2 of the semiconductor layer SC2. The opening ESCH2 is disposed spaced apart from the opening ESCH1 along the first direction X. In the present embodiment, the openings ESCH1 and ESCH2 may be referred to as a first opening and a second opening, respectively. When it is not particularly necessary to distinguish, the openings ESCH1 and ESCH2 are collectively referred to as an opening ESCH.

Each of the openings ESCH1 and ESCH2 has a substantially rectangular shape having a pair of long sides and a pair of short sides. In each of the openings ESCH1 and ESCH2, the long side extending along the second direction Y is longer than the short side extending along the first direction X. Alternatively, the opening ESCH is not limited to a substantially rectangular shape, and may be an elliptical shape having a major axis parallel to the second direction Y and a minor axis parallel to the first direction X. The opening ESCH is not limited to a rectangular shape or an elliptical shape, and may have a predetermined shape having a major axis and a minor axis, or a long side and a short side, and exposing at least two or more semiconductor layers SC through one opening ESCH.

Note that, in the present embodiment, a part of the semiconductor layer SC2 and the semiconductor layer SC1 other than the channel forming region RC1 may not overlap the scanning line GL. When the channel forming region RC1 of the semiconductor layer SC1 overlaps the scanning line GL, the semiconductor layer SC1 functions as a transistor, so that a part of the scanning line GL excluding the channel forming region RC1 of the semiconductor layer SC1 (specifically, a part of the region RS1 and a part of the region RD1) is exposed from the scanning line GL. As a result, a load due to the capacitance formed by a gate electrode (scanning line GL), the signal line SL, and the connection electrode DE can be reduced.

In other words, in the substrate SUB1 illustrated in FIGS. 1 and 5, the area where the scanning line GL overlaps the semiconductor layer SC1, the signal line SL, and the connection electrode DE is reduced. Alternatively, the semiconductor layer having a region not partially overlapping the scanning line GL may be the semiconductor layer SC2. In this case, the entire semiconductor layer SC1 overlaps the same scanning line GL.

In addition, "substantially" having substantially the same shape (substantially the same area) as described above means that, although the same shape (the same area) is adopted as a design idea, it is difficult to manufacture the same shape (the same area) in an ideal uniform manner, and thus, the same shape and area include some variations caused by a manufacturing process. In addition, "parallel" also means parallel as a design idea, and means including variations in angle caused by a manufacturing process because it is difficult to realize ideal parallel in manufacturing.

In addition, a connection electrode DTC is provided on the substrate SUB1 illustrated in FIG. 1. The connection electrode DTC overlaps the scanning line GL and is located spaced apart from the signal line SL in the first direction X. The connection electrode DTC is formed of the same material as the signal line SL and the connection electrode DE. The connection electrode DTC is connected to the scanning line GL through a contact hole CH1 formed in the insulating layer GI and the insulating layer ES.

FIGS. 1 and 5 illustrate a configuration in which two contact holes CH1 are provided. By providing a plurality of contact holes CH1, it is possible to improve the yield of the substrate SUB1. However, the present invention is not limited thereto, and only one contact hole CH1 may be provided. The same applies to other contact holes.

An auxiliary gate electrode TUG overlaps the scanning line GL, the connection electrode DTC, and the connection electrode DE in a planar view. The auxiliary gate electrode TUG only needs to overlap both the respective channel forming regions RC1 and RC2 of the semiconductor layers SC1 and SC2 in a planar view. In the present embodiment, the auxiliary gate electrode TUG overlaps the entire respective channel forming regions RC1 and RC2 of the semiconductor layers SC1 and SC2.

In addition, the auxiliary gate electrode TUG is connected to the connection electrode DTC through a contact hole CH2 formed in an insulating layer PAS. Consequently, the auxiliary gate electrode TUG is electrically connected to the scanning line GL through the connection electrode DTC.

However, the auxiliary gate electrode TUG, the connection electrode DTC, the contact hole CH1, and the contact hole CH2 may not be provided.

In the transistors Tr (Tr1 and Tr2) of the substrate SUB1 illustrated in FIG. 5, a base BA1, the scanning line GL (gate electrode), the insulating layer GI, the semiconductor layers SC (SC1 and SC2), the signal line SL, and the connection electrode DE are laminated in this order in the third direction Z. The signal line SL and the connection electrode DE are formed of the same material. The connection electrode DE extends along the second direction Y, is disposed spaced apart from the signal line SL in the first direction X, and is disposed in parallel with the signal line SL.

Although not illustrated as a cross-sectional view, the connection electrode DTC is provided in the same layer as the signal line SL and the connection electrode DE. The auxiliary gate electrode TUG is provided on the signal line SL, the connection electrode DE, and the connection electrode DTC with the insulating layer PAS interposed therebetween. Note that, in the present embodiment, a layer formed of the same material and formed in the same step are the same layer.

A pixel electrode PE will be described later.

The semiconductor layer SC is provided on the insulating layer GI. As described above, in the semiconductor layer SC, with the insulating layer GI interposed therebetween, a region in contact with the signal line SL is the region RS (RS1 and RS2), a region in contact with the connection electrode DE is the RD (RD1 and RD2), and a region held between the regions RS and RD is the channel forming region RC (RC1 and RC2).

As described above, the insulating layer ES is provided on the semiconductor layer SC, and the insulating layer ES has the opening ESCH.

Here, a manufacturing process of the semiconductor layer SC, the signal line SL, and the connection electrode DE will be described. After the semiconductor layer SC is formed, a conductive layer to be a material of the signal line SL and the connection electrode DE is formed. The conductive layer is patterned by, for example, dry etching to form the signal line SL and the connection electrode DE having a desired shape. The transistor formed in such a manufacturing process is referred to as a so-called channel-etched transistor.

In the channel-etched transistor, since the conductive layer is patterned to separate the signal line SL and the connection electrode DE, there is an advantage that the signal line SL and the connection electrode DE can be formed in one patterning process. On the other hand, in the patterning process, the channel forming region RC of the semiconductor layer SC may be also etched, and the channel forming region RC may be damaged. The damage to the channel forming region RC may adversely affect the characteristics of the transistor. As a result, a difference in characteristics of the transistor occurs, a difference in characteristics occurs in the entire substrate, and non-uniformity in characteristics may occur in the semiconductor substrate.

Therefore, in the present embodiment, after the semiconductor layer SC is formed, the insulating layer ES is laminated on the semiconductor layer SC with an inorganic insulating material, for example, silicon oxide, and then an opening is formed only in a connection region between the signal line SL and the connection electrode DE in the insulating layer ES. A so-called channel stopper transistor is formed. In the channel stopper transistor, the channel forming region RC is covered with the insulating layer ES. Therefore, even in the step of forming the signal line SL and the connection electrode DE, that is, when a conductive layer is formed on the insulating layer ES and the conductive layer is patterned by, for example, dry etching or the like, the channel forming region RC is not damaged. Therefore, occurrence of non-uniformity in characteristics in the semiconductor substrate is suppressed, and uniform characteristics can be obtained.

In FIGS. 6 and 8, among end portions of the components, end portions located side by side along the first direction X and extending along the second direction Y will be described. An end portion of the semiconductor layer SC1 on the signal line SL side and an end portion of the semiconductor layer SC1 on the connection electrode DE side are referred to as end portions EO1$a$ and EO1$b$, respectively. An end portion of the semiconductor layer SC2 on the signal line SL side and an end portion of the semiconductor layer SC2 on the connection electrode DE side are referred to as end portions EO2$a$ and EO2$b$, respectively. The end portions EO1$a$ and EO2$a$ may be collectively referred to as an end portion EO$a$. The end portions EO1$b$ and EO2$b$ may be collectively referred to as an end portion EO$b$.

The end portions EO1$a$ and EO1$b$ are arranged spaced apart from each other in the first direction X. The end portions EO2$a$ and EO2$b$ are arranged spaced apart from each other in the first direction X.

Of end portions of the signal line SL, an end portion overlapping the semiconductor layer SC is referred to as an end portion ER1, and an end portion not overlapping the semiconductor layer SC is referred to as an end portion ER2. Of end portions of the connection electrode DE, an end portion overlapping the semiconductor layer SC is referred to as an end portion ED1, and an end portion not overlapping the semiconductor layer SC is referred to as an end portion ED2. The end portion ER1 and the end portion ED1 are adjacent to each other and opposed to each other.

The end portions ER1 and ER2 are arranged spaced apart from each other in the first direction X. The end portions ED1 and ED2 are arranged spaced apart from each other in the first direction X.

Of end portions of the opening ESCH1 of the insulating layer ES, an end portion overlapping the semiconductor layer SC1 is referred to as an end portion ET1$a$, and an end portion not overlapping the semiconductor layer SC is referred to as an end portion ET1$b$. Of end portions of the opening ESCH2, an end portion overlapping the semiconductor layer SC is referred to as an end portion ET2$a$, and an end portion not overlapping the semiconductor layer SC is referred to as an end portion ET2$b$. The end portions ET1$a$ and ET2$a$ are adjacent to each other and opposed to each other and spaced apart from each other in the first direction X. The end portions ET1$a$ and ET1$b$ correspond to a pair of long sides of the opening ESCH1 (or end portions along the major axis of the opening ESCH1). The end portions ET1$c$ and ET1$d$ correspond to a pair of short sides of the opening ESCH1 (or end portions along the minor axis of the opening ESCH1). The end portions ET2$a$ and ET2$b$ correspond to a pair of long sides of the opening ESCH2 (or end portions along the major axis of the opening ESCH2). The end portions ET2$c$ and ET2$d$ correspond to a pair of short sides of the opening ESCH2 (or end portions along the minor axis of the opening ESCH2).

FIG. 8 illustrates an example in which the end portions ER2 and ET1$b$ do not match with each other, and the end portions ED2 and ET2$b$ do not match with each other, but the present invention is not limited thereto. Each of the end portions ER2 and ET1$b$ and each of the end portions ED2 and ET2$b$ may match with each other.

The end portion EO1$a$ is located between the end portions ET1$a$ and ET1$b$. The end portion ET1$a$ is located between the end portions EO1$a$ and ER1.

The end portion EO1$b$ is located between the end portions ET2$a$ and ET2$b$. The end portion ET2$a$ is located between the end portions EO1$b$ and ED1.

In other words, the end portion EO1$a$ is located in the opening ESCH1. The end portion EO1$b$ is located in the opening ESCH2.

The end portion EO1$a$ is separated from the end portion ET1$b$ by a distance d1$a$ along the first direction X. The end portion ET1$a$ is separated from the end portion EO1$a$ by a distance d1$b$ along the first direction X.

The end portion EO1$b$ is separated from the end portion ET2$b$ by a distance d2$a$ along the direction opposite to the first direction X. The end portion ET2$a$ is separated from the end portion EO1$b$ by a distance d2$b$ along the direction opposite to the first direction X.

The openings ESCH1 and ESCH2 overlap the semiconductor layers SC1 and SC2, respectively. Therefore, each of the lengths of the end portions ET1$a$ and ET1$b$ of the opening ESCH1 is longer than the sum of the lengths of the end portion EO1$a$ of the semiconductor layer SC1 and the end portion EO2$a$ of the semiconductor layer SC2.

Similarly, each of the lengths of the end portions ET2$a$ and ET2$b$ of the opening ESCH2 is longer than the sum of the lengths of the end portion EO1$b$ of the semiconductor layer SC1 and the end portion EO2$b$ of the semiconductor layer SC2.

In addition, the opening ESCH only needs to be in contact with two or more semiconductor layers SC in which the signal line SL and the connection electrode DE are arranged in parallel, and the end portions ET1b and ET2b of the rectangular opening ESCH connected to the two or more semiconductor layers SC may be formed inside the end portions EO1a, EO1b, EO2a, and EO2b of the semiconductor layer SC. Specifically, the end portions ET1b and ET2b may be located between the end portions EO1a and EO1b of the semiconductor layer SC1. Similarly, the end portions ET1b and ET2b may be located between the end portions EO2a and EO2b of the semiconductor layer SC2.

The end portion ER1 of the signal line SL is separated from the end portion E11a of the opening ESCH1 by a distance d1c along the first direction X. The end portion ED1 of the connection electrode DE is separated from the end portion ET2a of the opening ESCH2 by a distance d2c along the direction opposite to the first direction X.

Note that, since FIGS. 7 and 8 illustrate the cross section of the transistor Tr1, the semiconductor layer SC1 which is a component of the transistor Tr1 is described as an example, but the same applies to the semiconductor layer SC2 of the transistor Tr2.

In each of the semiconductor layers SC1 and SC2, the lengths of the channel forming regions RC1 and RC2 along the first direction X are referred to as channel lengths L1 and L2, respectively. When it is not particularly necessary to distinguish, the channel length is simply referred to as a channel length L. The channel length L corresponds to a distance between the end portion ET1a of the opening ESCH1 and the end portion ET2a of the opening ESCH2.

Among the end portions of the components, the end portions located side by side along the second direction Y and extending along the first direction X will be described. Among the end portions of the semiconductor layer SC1, an end portion adjacent to the semiconductor layer SC2 is referred to as an end portion EO1d, and an end portion opposite to the end portion EO1d is referred to as an end portion EO1c.

Among the end portions of the semiconductor layer SC2, an end portion adjacent to the semiconductor layer SC1 is referred to as an end portion EO2d, and an end portion opposite to the end portion EO2d is referred to as an end portion EO2c. The end portions EO1d and EO2d are opposed to each other and spaced apart from each other in the second direction Y.

The semiconductor layers SC1 and SC2 are arranged between the end portions ET1c and ET1d and between the end portions ET2c and ET2d. That is, the end portions EO1c and EO2c are arranged between the end portions ET1c and End and between the end portions ET2c and ET2d.

The end portion EO1c does not match with the end portions ET1c and ET2c. The end portion EO1c of the semiconductor layer SC1 is separated from the end portion ET1c of the opening ESCH1 by a distance g1a along the second direction Y. The end portion EO1c of the semiconductor layer SC1 is separated from the end portion ET2c of the opening ESCH2 by a distance g2a along the second direction Y. If the end portions ET1c and ET2c are located on the same line extending in the first direction X, the distances g1a and g2a match with each other. In this case, the distances g1a and g2a may be rephrased as a distance ga.

The end portion EO2c does not match with the end portions End and ET2d. The end portion EO2c of the semiconductor layer SC2 is separated from the end portion ET1d of the opening ESCH1 by a distance g1b along the direction opposite to the second direction Y. The end portion EO2c of the semiconductor layer SC2 is separated from the end portion ET2d of the opening ESCH2 by a distance g2b along the direction opposite to the second direction Y. When the end portions ET1d and ET2d are located on the same line extending in the first direction X, the distances g1b and g2b match with each other. In this case, the distances g1b and g2b may be rephrased as a distance gb.

In each of the semiconductor layers SC1 and SC2, the lengths of the channel forming regions RC1 and RC2 along the second direction Y are referred to as channel widths W1 and W2, respectively. When it is not particularly necessary to distinguish, the channel width is simply referred to as a channel width W. The channel width W corresponds to a length of the semiconductor layer SC along the second direction Y.

The channel width W of the transistor Tr1 can be maintained by separating the end portion ET1c of the opening ESCH1 and the end portion ET2c of the opening ETSCH2 from the end portion EO1c of the semiconductor layer SC1. Similarly, the channel width W of the transistor Tr2 can be maintained by separating the end portion ET1d of the opening ESCH1 and the end portion ET2d of the opening ETSCH2 from the end portion 502c of the semiconductor layer SC2.

The base BA1 shown in FIG. 8 is formed of an insulating material such as resin or glass. An insulating layer (referred to as UC) (not illustrated) may be provided between the base BA1 and the scanning line GL.

As illustrated in FIG. 7, a further insulating layer PAS is formed to cover the insulating layer ES, the signal line SL, and the connection electrode DE.

In a case where the insulating layer GI, the insulating layer UC, and the insulating layer PAS are provided, each insulating layer is an inorganic insulating layer using an oxide such as silicon oxide or a nitride such as silicon nitride. Each of the insulating layer UC, the insulating layer GI, and the insulating layer PAS is not limited to a single layer, and a plurality of insulating layers may be laminated. For example, a laminated film of silicon oxide and silicon nitride may be used for the insulating layer UC, a silicon oxide film may be used for the insulating layer GI, and a laminated film of silicon oxide and silicon nitride may be used for the insulating layer PAS.

As the insulating layer ES, the above-described silicon oxide or a laminated film of silicon oxide and silicon nitride may be used.

However, for example, it is preferable to use silicon oxide as the insulating layer ES, and to use a laminate of two layers of silicon nitride and silicon oxide as the insulating layer GI. Alternatively, for example, it is preferable that silicon oxide is used as the insulating layer ES, and the insulating layer GI does not contain the same silicon oxide as the insulating layer ES. The same silicon oxide means that the ratio between silicon and oxygen is substantially the same. That is, the ratio of silicon and oxygen in the insulating layer ES and the insulating layer GI is preferably different. In a case where both the insulating layers ES and GI are the same silicon oxide, there is a possibility that the lower insulating layer GI is etched in the etching for providing the opening ESCH. For example, as illustrated in FIG. 9, when the insulating layer GI is a laminate of two layers of an insulating layer GI1 formed of silicon nitride and an insulating layer GI2 formed of silicon oxide, the insulating layer GI2 formed of the upper silicon oxide is affected by the etching of the insulating layer ES, but the insulating layer GI1 formed of the lower silicon nitride can prevent excessive etching.

As illustrated in FIGS. 7 and 9, on the insulating layer PAS, the auxiliary gate electrode TUG is formed and an organic resin layer covering the insulating layer PAS and the auxiliary gate electrode TUG, specifically, an insulating layer PLN containing an acrylic resin or a polyimide resin is provided. On the insulating layer PLN, the pixel electrode PE is provided so as to cover a part of each of the transistors Tr1 and Tr2.

The scanning line GL, the signal line SL, the connection electrode DE, the connection electrode DTC, and the auxiliary gate electrode TUG are formed of a metal material such as Al (aluminum), Ti (titanium), Ag (silver), Mo (molybdenum), W (tungsten), Cu (copper), or Cr (chromium), an alloy obtained by combining these metal materials, or the like. In addition, a single-layer structure of these metal materials and alloys may be used, or a multilayer structure in which the above-described metal materials are appropriately laminated may be used.

Figure 10A:
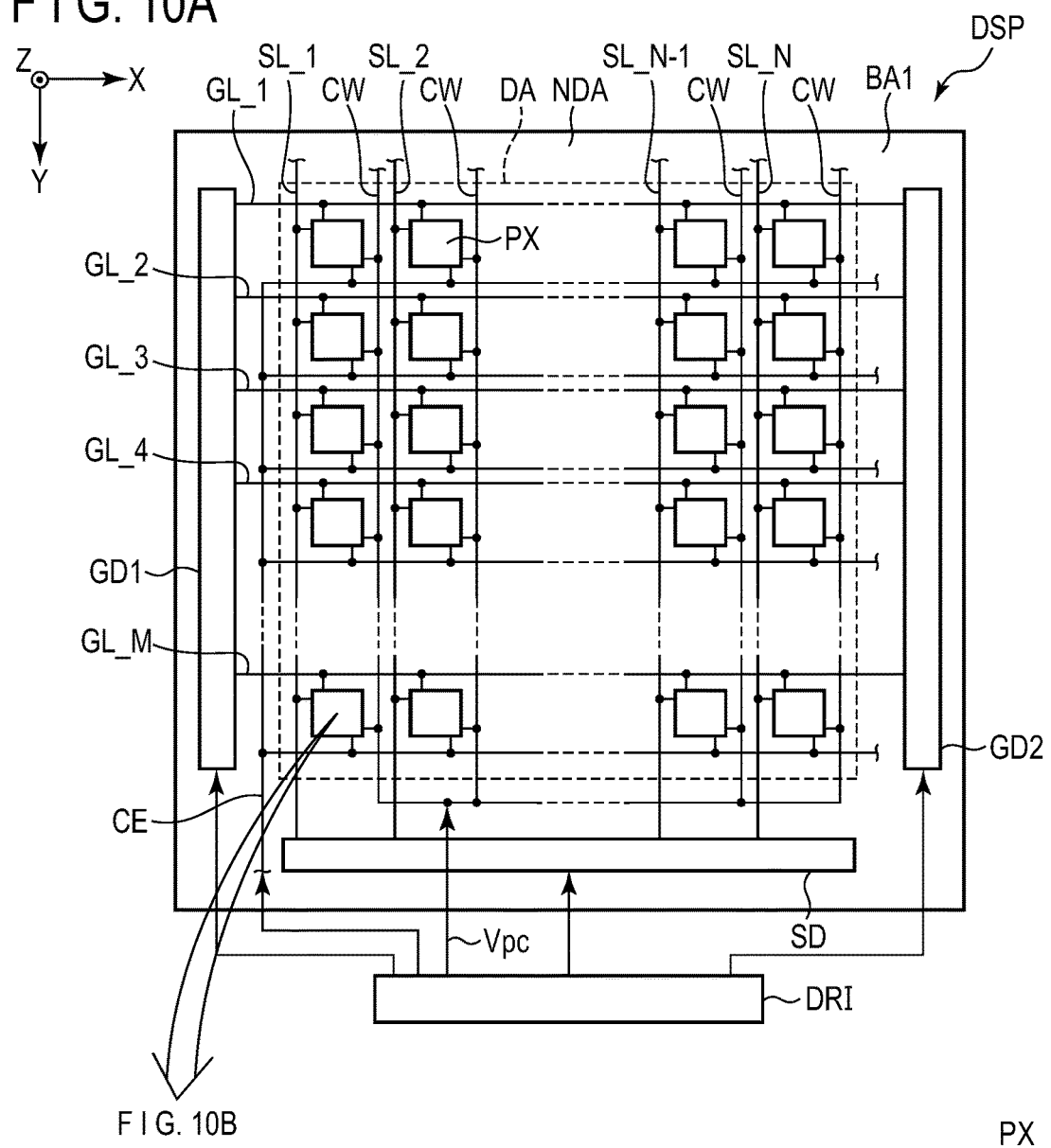
FIG. 10A is a view for describing a display device of the present embodiment.
Figure 10B:
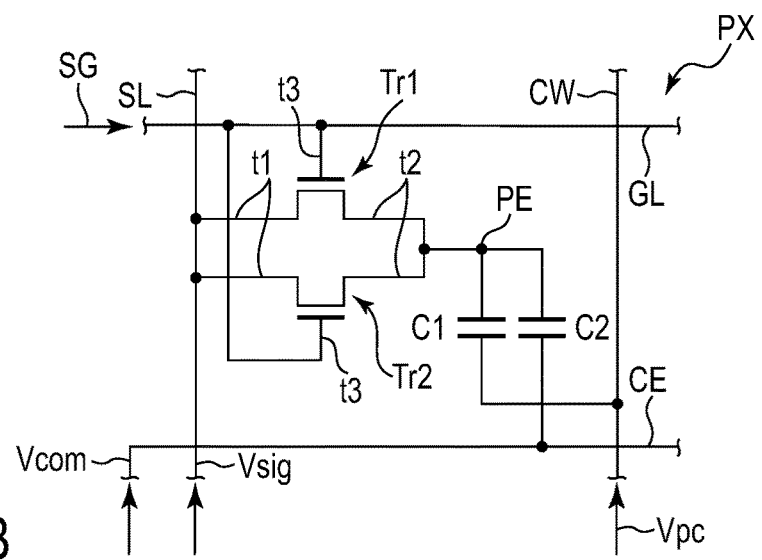
FIG. 10B is a view illustrating the display device of the present embodiment.

FIGS. 10A and 10B are diagrams illustrating the display device of the present embodiment. FIG. 10A is a circuit diagram illustrating a display device DSP of the present embodiment. FIG. 10B is a circuit diagram illustrating one pixel PX of the display device DSP of FIG. 10A. Note that, in FIGS. 10A and 10B, all the pixels PX and all the wirings are not illustrated.

The display device DSP includes a display area DA for displaying an image and a non-display area NDA other than the display area DA. In the present embodiment, the non-display area NDA is formed in a frame shape.

As illustrated in FIG. 10A, the display device DSP includes a base BA1, a plurality of pixels PX arranged in a matrix above the base BA1 in the display area DA, a plurality of scanning lines GL, a plurality of signal lines SL, and a plurality of capacitive lines CW. The scanning line and the signal line are also referred to as a gate line and a source line, respectively.

In the present embodiment, the number of scanning lines GL is denoted by M, and the scanning lines GL are denoted by scanning lines GL_1 to GL_M, respectively. However, when it is not necessary to distinguish the scanning lines from each other, the scanning lines are simply referred to as scanning lines GL. In addition, the number of signal lines SL is denoted by N, and the signal lines SL are denoted by signal lines SL_1 to SL_N, respectively. However, when it is not necessary to distinguish the signal lines SL from each other, the signal lines SL are simply referred to as signal lines SL. That is, the display device DSP has pixels PX of M rows and N columns.

The display device DSP includes scanning line drive circuits GD1 and GD2 (also referred to as gate drivers) and a signal line drive circuit SD (also referred to as a source driver). The scanning line drive circuits GD1 and GD2 drive the scanning lines GL described later. The scanning line drive circuits GD1 and GD2 are arranged in the non-display area NDA. The signal line drive circuit SD drives the signal line SL. The signal line drive circuit SD is disposed in the non-display area NDA.

The scanning lines GL are connected to the scanning line drive circuit GD, extend in the first direction X, and are arranged side by side in the second direction Y. The scanning line GL is electrically connected to the plurality of pixels PX arranged in the first direction X. The signal lines SL are connected to the signal line drive circuit SD, extend in the second direction Y, and are arranged side by side in the first direction X. The signal line SL is electrically connected to the plurality of pixels PX arranged in the second direction Y. The capacitive line CW extends in the first direction X or the second direction Y. In the present embodiment, the capacitive line CW extends in the second direction Y and is electrically connected to the plurality of pixels PX arranged in the second direction Y. The plurality of capacitive lines CW are bundled in the non-display area NDA and connected to a drive element DRI.

The scanning line drive circuit GD applies a control signal SG to the scanning line GL to drive the scanning line GL. The signal line drive circuit SD applies an image signal (for example, a video signal) Vsig to the signal line SL to drive the signal line SL. The drive element DRI applies a constant voltage Vpc to the capacitive line CW, and the capacitive line CW is fixed to a constant potential. Further, the drive element DRI applies a common voltage Vcom to a counter-electrode CE, and the counter-electrode CE is fixed to a constant potential (common potential). In the present embodiment, the counter-electrode CE can be referred to as a common electrode because it is shared by all the pixels PX. In the present embodiment, the capacitive line CW is set to the same potential as the counter-electrode CE, but may be set to a potential different from the counter-electrode CE. The scanning line drive circuit GD, the signal line drive circuit SD, and the drive element DRI constitute a drive unit for driving the plurality of pixels PX.

As illustrated in FIG. 10B, each pixel PX includes the transistors Tr1 and Tr2 described above, and a first capacitor C1 and a second capacitor C2.

The transistors Tr1 and Tr2 each have a first terminal t1, a second terminal t2, and a control terminal t3. In the present embodiment, the control terminal t3 functions as a gate electrode, one of the first terminal t1 and the second terminal t2 functions as a source electrode (signal line SL), and the other of the first terminal t1 and the second terminal t2 functions as a connection electrode DE. The transistors Tr1 and Tr2 are electrically connected in parallel between the signal line SL and the pixel electrode PE.

In each of the transistors Tr1 and Tr2, the first terminal t1 is connected to the signal line SL, the second terminal t2 is connected to the pixel electrode PE, and the control terminal t3 is connected to the scanning line GL. As a result, each of the transistors Tr1 and Tr2 is switched to the conductive state or the non-conductive state by the control signal SG applied to the scanning line GL. The image signal Vsig is applied to the pixel electrode PE via the signal line SL and the transistors Tr1 and Tr2 in the conductive state.

The first capacitor C1 and the second capacitor C2 are capacitors. The first capacitor C1 is connected between the pixel electrode PE and the capacitive line CW. The second capacitor C2 is connected between the pixel electrode PE and the counter-electrode CE.

Figure 11:
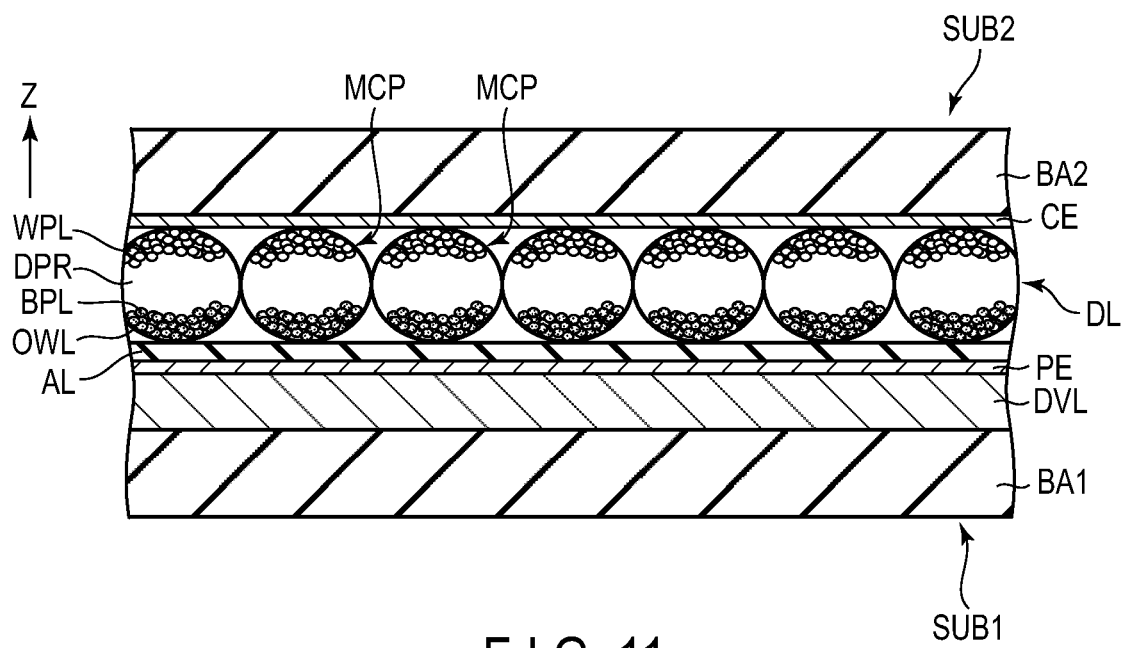
FIG. 11 is a cross-sectional view illustrating the display device.

FIG. 11 is a cross-sectional view illustrating the display device DSP. Here, the description is given focusing on one pixel PX.

As illustrated in FIG. 11, the substrate SUB1 includes a base BA1, a drive element layer DVL provided on the base BA1, and a pixel electrode PE provided on the drive element layer DVL.

The drive element layer DVL includes the transistors Tr1 and Tr2, the scanning line GL, the signal line SL, the wiring layers, the insulating layers, and the like described above.

The substrate SUB2 includes a base BA2 opposed to the pixel electrode PE, and a counter-electrode CE located between the base BA2 and the pixel electrode PE and opposed to the pixel electrode PE. The counter-electrode CE is formed of a transparent conductive material such as indium tin oxide (ITO) or indium zinc oxide (IZO).

In the present embodiment, the substrate SUB1 is a semiconductor substrate, and the substrate SUB2 is a counter-substrate. The bases BA1 and BA2 are formed of an insulating material such as resin or glass. In the present embodiment, the base BA2 is located on the screen side (observation side) and has optical transparency. Since the base BA1 is located on the opposite side of the screen, the base BA1 may be opaque or transparent. Note that, the bases BA1 and BA2 may be referred to as a first base and a second base, respectively. The substrates SUB1 and SUB2 may be referred to as a first substrate and a second substrate, respectively.

A display function layer DL of the display device DSP is located between the pixel electrode PE and the counter-electrode CE. A voltage applied between the pixel electrode PE and the counter-electrode CE is applied to the display function layer DL. In the present embodiment, the display device DSP is an electrophoretic display device, and the display function layer DL is an electrophoretic layer. The display function layer DL is formed of a plurality of microcapsules MCP arranged with almost no gap in the X-Y plane.

An adhesive layer AL of the display device DSP is located between the pixel electrode PE and the display function layer DL.

The microcapsule MCP is, for example, a spherical body having a particle size of about 20 μm to 70 μm. In the illustrated example, many microcapsules MCP are arranged between one pixel electrode PE and the counter-electrode CE due to scale, but about one to ten microcapsules MCP are arranged in a rectangular or polygonal pixel PX having a side length of about 100 to several hundred μm.

The microcapsule MCP includes a dispersion medium DPR, a plurality of black particles BPL, and a plurality of white particles WPL. The black particles BPL and the white particles WPL may be referred to as electrophoretic particles. An outer shell (wall film) OWL of the microcapsule MCP is formed using, for example, a transparent resin such as an acrylic resin. The dispersion medium DPR is a liquid in which the black particles BPL and the white particles WPL are dispersed in the microcapsule MCP. The black particles BPL are, for example, particles (polymer or colloid) made of a black pigment such as aniline black, and are positively charged, for example. The white particles WPL are, for example, particles (polymer or colloid) made of a white pigment such as titanium dioxide, and are negatively charged, for example. Various additives can be added to these pigments as necessary. In addition, instead of the black particles BPL and the white particles WPL, for example, pigments such as red, green, blue, yellow, cyan, and magenta may be used.

In the display function layer DL having the above configuration, when the pixel PX is displayed in black, the pixel electrode PE is held at a relatively higher potential than the counter-electrode CE. That is, when the potential of the counter-electrode CE is set as the reference potential, the pixel electrode PE is held in the positive polarity. As a result, the positively charged black particles BPL are attracted to the counter-electrode CE, while the negatively charged white particles WPL are attracted to the pixel electrode PE. As a result, when the pixel PX is observed from the counter-electrode CE side, black is visually recognized. On the other hand, in a case where the pixel PX is displayed in white, when the potential of the counter-electrode CE is set as the reference potential, the pixel electrode PE is held in the negative polarity. As a result, the negatively charged white particles WPL are attracted toward the counter-electrode CE, while the positively charged black particles BPL are attracted toward the pixel electrode PE. As a result, when the pixel PX is observed, white is visually recognized.

Note that, in the present embodiment, the pixel electrode PE is in contact with the adhesive layer AL. However, an insulating protective layer may be interposed between the pixel electrode PE and the adhesive layer AL, and the pixel electrode PE may be protected by the protective layer.

Figure 12:
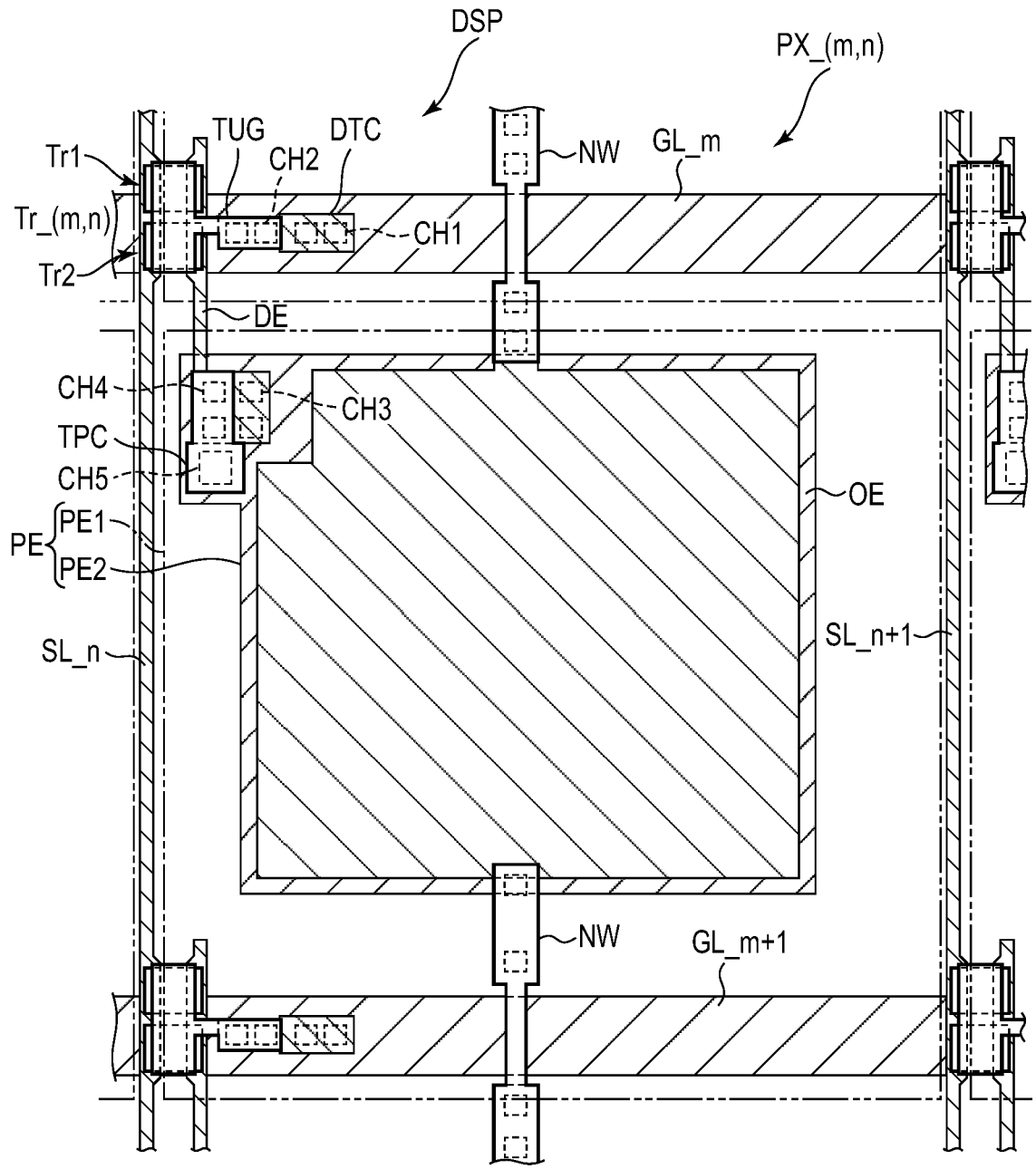
FIG. 12 is an enlarged plan view illustrating a part of the display device.

FIG. 12 is an enlarged plan view illustrating a part of the display device.

The pixel electrode PE includes a pixel electrode PE1 and a pixel electrode PE2 electrically connected to each other. The scanning line GL intersects the pixel electrode PE1. The pixel electrode PE2 is located spaced apart from the scanning line GL in the second direction Y.

Here, the transistors Tr1 and Tr2 connected to the scanning line GL_m of the m-th row and the signal line SL_n of the n-th column are referred to as transistors Tr_(m, n) (where m is a natural number of 1 or more and M−1 or less, and n is a natural number of 1 or more and N−1 or less.). A pixel PX including the transistor Tr_(m, n) and partitioned by the scanning line GL_m, the scanning line GL_m+1, the signal line SL_n, and the signal line SL_n+1 is referred to as a pixel PX (m, n).

Note that, hereinafter, the pixel of the n-th column will be mainly described, and "n" indicating the column will be omitted if not particularly necessary.

The connection electrode DTC of the pixel PX (m, n) overlaps the scanning line GL_m, and is located spaced apart from the signal line SL_n and the signal line SL_n+1 in the first direction X.

The connection electrode DE of the pixel PX (m, n) extends in the second direction Y. One end portion of the connection electrode DE of the pixel PX (m, n) is located between the signal line SL_n and the connection electrode DTC in the region overlapping the scanning line GL_m, and overlaps each semiconductor layer SC as described above. The other end portion of the connection electrode DE of the pixel PX (m, n) overlaps the pixel electrode PE2 of the pixel PX (m, n).

The capacitive electrode OE is located spaced apart from the semiconductor layer SC, the signal line SL, the connection electrode DTC, and the connection electrode DE, and overlaps the pixel electrode PE1 and the pixel electrode PE2. In the present embodiment, the entire capacitive electrode OE is located inside the pixel electrode PEI and inside the pixel electrode PE2 in a planar view. The capacitive electrodes OE of the pixel PX (m, n) and the pixel PX (m−1, n) one row before are opposed to each other with respect to the scanning line GL_m. The capacitive electrode OE is formed in the same layer as the signal line SL and the connection electrode DE.

The connection line NW extends in the second direction Y, intersects the scanning line GL, and does not intersect the signal line SL. The connection line NW connects two capacitive electrodes OE adjacent to each other in the second direction Y with the scanning line GL interposed therebetween. The connection line NW is formed in the same layer as the auxiliary gate electrode TUG. In the present embodiment, the plurality of connection lines NW and the plurality of capacitive electrodes OE arranged in the second direction Y are electrically connected to form the capacitive line CW.

The connection electrode TPC is located spaced apart from the auxiliary gate electrode TUG, and overlaps the connection electrode DE and the pixel electrode PE1. The connection electrode TPC is electrically connected to the pixel electrode PE1 via a contact hole CH5 formed in the insulating layer PLN. The connection electrode TPC is electrically connected to the connection electrode DE via a contact hole CH4 formed in the insulating layer PAS.

Note that, the connection electrode DE is electrically connected to the pixel electrode PE2 via a contact hole CH3 formed in the insulating layer GI and the insulating layer ES. As a result, the connection electrode DE, the connection electrode TPC, the pixel electrode PE1, and the pixel electrode PE2 are electrically connected.

The scanning line GL and the pixel electrode PE2 are formed of the same material. The signal line SL, the connection electrode DE, the connection electrode DTC, and the capacitive electrode OE are formed of the same material. The auxiliary gate electrode TUG, the connection electrode TPC, and the connection line NW are formed of the same material.

In addition, the connection line NW may be formed of the same material as the signal line SL.

That is, the scanning line GL, the pixel electrode PE2, the signal line SL, the connection electrode DE, the connection electrode DTC, the capacitive electrode OE, the connection line NW, the auxiliary gate electrode TUG, and the connection electrode TPC are formed of a metal material such as Al (aluminum), Ti (titanium), Ag (silver), Mo (molybdenum), W (tungsten), Cu (copper), or Cr (chromium), an alloy obtained by combining these metal materials, or the like. In addition, a single-layer structure of these metal materials and alloys may be used, or a multilayer structure in which the above-described metal materials are appropriately laminated may be used.

The pixel electrode PE1 includes a transparent conductive layer or a light-reflective layer, or a laminate of a light-reflective layer and a transparent conductive layer.

Similarly to the counter-electrode CE, the transparent conductive layer is formed of a transparent conductive material such as indium tin oxide (ITO) or indium zinc oxide (IZO).

The semiconductor substrate of the above-described embodiment is not limited to the above-described substrate SUB1, and can be applied to various semiconductor substrates.

In addition, the display device DSP of the above-described embodiment is not limited to the above-described electrophoretic display device, and can be applied to various display devices. For example, the display device DSP may be a liquid crystal display device. In this case, the display function layer DL is a liquid crystal layer. For example, polymer dispersed liquid crystal (PDLC) may be used as the liquid crystal layer.

In the present disclosure, the end portion EO1a of the semiconductor layer SC1 is referred to as a first end portion, and the end portion EO1b is referred to as a second end portion. The end portion ET1a of the opening ESCH1 is referred to as a third end portion, and the end portion ET1b is referred to as a fourth end portion. The end portion ET2a of the opening ESCH2 is referred to as a fifth end portion, and the end portion ET2b is referred to as a sixth end portion. The end portion ER1 of the signal line SL is referred to as a seventh end portion, and the end portion ED1 of the connection electrode DE is referred to as an eighth end portion.

The end portion EO1c of the semiconductor layer SC1 is referred to as a ninth end portion, and the end portion EO1d is referred to as a tenth end portion. The end portion EO2c of the semiconductor layer SC2 is referred to as an eleventh end portion, and the end portion EO2d is referred to as a twelfth end portion. The end portion ET1c of the opening ESCH1 is referred to as a thirteenth end portion, and the end portion ET1d is referred to as a fourteenth end portion. The end portion ET2c of the opening ESCH2 is referred to as a fifteenth end portion, and the end portion ET2d is referred to as a sixteenth end portion.

However, the numbers are given for convenience and are not limited to the above.

The end portion EO1a (first end portion), the end portion EO1b (second end portion), the end portion ET1a (third end portion), the end portion ET1b (fourth end portion), the end portion ET2a (fifth end portion), the end portion ET2b (sixth end portion), the end portion ER1 (seventh end portion), and the end portion ED1 (eighth end portion) are arranged spaced apart from each other in the first direction X.

The end portion EO1c (ninth end portion), the end portion EO1d (tenth end portion), the end portion EO2c (eleventh end portion), the end portion EO2d (twelfth end portion), the end portion ET1c (thirteenth end portion), and the end portion ET2c (fifteenth end portion), and the end portion ET1d (fourteenth end portion) and the end portion ET2d (sixteenth end portion) are arranged spaced apart from each other in the second direction Y.

Configuration Example 1

Figure 13:
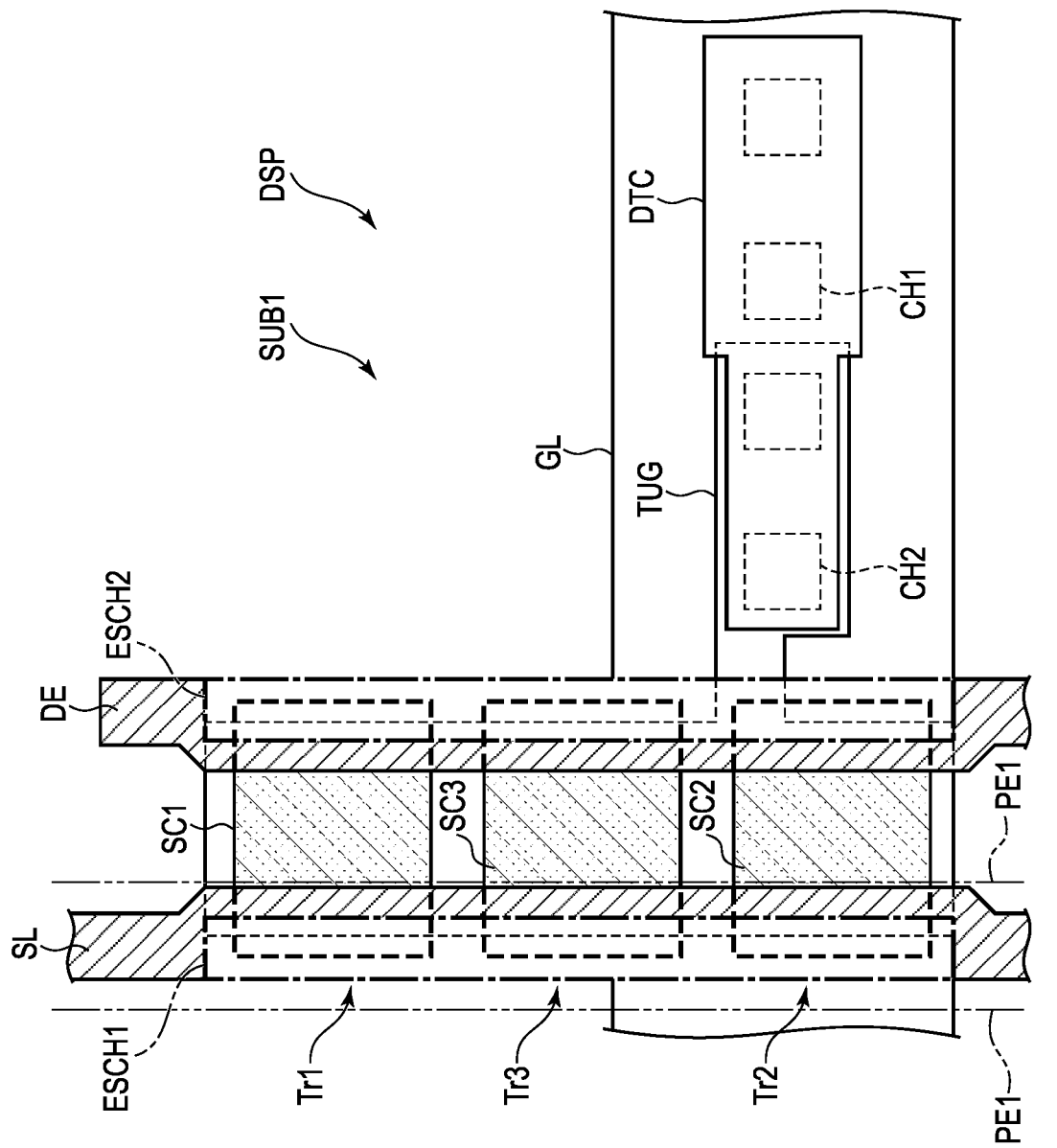
FIG. 13 is a plan view illustrating another configuration example of the semiconductor substrate in the embodiment.

FIG. 13 is a plan view illustrating another configuration example of the semiconductor substrate according to the embodiment. The configuration example illustrated in FIG. 13 is different from the configuration example illustrated in FIG. 1 in that three transistors are provided.

The substrate SUB1 illustrated in FIG. 13 includes the transistor Tri between the transistors Tr1 and Tr2 illustrated in FIG. 1. The transistor Tr3 is disposed between the transistors Tr1 and Tr2 along the second direction Y. The semiconductor layer SC3 of the transistor Tr3 is provided between the semiconductor layer SC1 of the transistor Tr1 and the semiconductor layer SC2 of the transistor Tr2.

By increasing the number of semiconductor layers SC arranged in parallel, the same effect as that of increasing the channel width W of the transistor can be obtained. That is, it is possible to increase the current flowing through the transistor. As a result, it is possible to obtain the effect of increasing the breakdown voltage and improving the mobility of the transistor.

Note that, in the present configuration example, an example in which three transistors are provided has been described, but the present invention is not limited thereto. The number of transistors may be four or more. In that case, two or more transistors may be provided between the transistors Tr1 and Tr2, that is, two or more semiconductor layers may be provided between the semiconductor layers SC1 and SC2.

The substrate SUB1 of the present configuration example can also be applied to a display device similarly to the above-described embodiment.

Also in the present configuration example, the same effects as those of the embodiment are obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor substrate, comprising:
a plurality of scanning lines each of which extends in a first direction;
a plurality of signal lines each of which intersects each of the scanning lines, and extends in a second direction;
a plurality of pixels each of which is portioned by two of the scanning lines and two of the signal lines;
a first semiconductor layer and a second semiconductor layer that overlap each of the scanning lines; and
an insulating layer that covers the first semiconductor layer and the second semiconductor layer on which the plurality of signal lines are provided;
wherein
one pixel of the plurality of pixels comprises the first semiconductor layer and the second semiconductor layer,
the first semiconductor layer and the second semiconductor layer in the one pixel are connected to one of the signal lines corresponding to the one pixel, and overlap to one of the scanning lines corresponding to the one pixel,
the insulating layer includes a first opening including a pair of long sides and a pair of short sides,
the long sides of the first opening are parallel to the second direction, and the short sides of the first opening are parallel to the first direction, and
the one of the signal lines is connected to the first semiconductor layer and the second semiconductor layer via the first opening in the one pixel.

2. The semiconductor substrate according to claim 1, wherein
the one pixel further comprises a connection electrode and a pixel electrode,
the connection electrode is provided on the insulating layer and parallel to the signal lines,
the pixel electrode is connected to the connection electrode, wherein
the insulating layer includes a second opening that includes a pair of long sides and a pair of short sides in the one pixel,
the second opening is disposed spaced apart from the first opening in the first direction,
the long sides of the second opening are parallel to the second direction, and the short sides of the second opening are parallel to the first direction, and
the connection electrode is connected to the first semiconductor layer and the second semiconductor layer via the second opening.

3. The semiconductor substrate according to claim 1, wherein
the first semiconductor layer is provided spaced apart from the second semiconductor layer in the one pixel along the second direction, and
the first semiconductor layer and the second semiconductor layer in the one pixel are located between a pair of short sides of the first opening in the second direction.

4. A semiconductor substrate, comprising:
a scanning line that extends in a first direction;
a first insulating layer that is provided on the scanning line;
an oxide semiconductor layer that overlaps the scanning line on the first insulating layer;
a second insulating layer that is provided on the oxide semiconductor layer;
a first opening and a second opening that are provided in the second insulating layer;
a signal line that is provided on the second insulating layer and extends in a second direction intersecting the first direction; and
a connection electrode that is provided on the second insulating layer and extends in the second direction, wherein
the signal line is connected to the oxide semiconductor layer via the first opening,
the connection electrode is connected to the oxide semiconductor layer via the second opening,
the oxide semiconductor layer has a first end portion and a second end portion extending in the second direction,
the first opening has a third end portion and a fourth end portion extending in the second direction,
the second opening has a fifth end portion and a sixth end portion extending in the second direction,
the third end portion and the fifth end portion are opposed to each other and spaced apart from each other in the first direction,
the first end portion is located between the third end portion and the fourth end portion in the first direction, and
the second end portion is located between the fifth end portion and the sixth end portion in the first direction.

5. The semiconductor substrate according to claim 4, wherein
the signal line has a seventh end portion that overlaps the oxide semiconductor layer and extends in the second direction,
the connection electrode has an eighth end portion that overlaps the oxide semiconductor layer, extends in the second direction, and is opposed to the seventh end portion,
the third end portion is located between the first end portion and the seventh end portion in the first direction, and
the fifth end portion is located between the second end portion and the eighth end portion in the first direction.

6. The semiconductor substrate according to claim 4, wherein
the oxide semiconductor layer includes a first oxide semiconductor layer and a second oxide semiconductor layer,
the second oxide semiconductor layer is disposed spaced apart from the first oxide semiconductor layer in the second direction,
the first oxide semiconductor layer has a ninth end portion and a tenth end portion extending along the first direction,
the second oxide semiconductor layer has an eleventh end portion and a twelfth end portion extending along the first direction,
the first opening has a thirteenth end portion and a fourteenth end portion extending along the first direction,
the second opening has a fifteenth end portion and a sixteenth end portion extending along the first direction,
the tenth end portion and the twelfth end portion are opposed to each other and spaced apart from each other in the second direction,
the ninth end portion is located between the tenth end portion and the thirteenth end portion and between the tenth end portion and the fifteenth end portion in the second direction, and the eleventh end portion is located between the twelfth end portion and the fourteenth end portion and between the twelfth end portion and the sixteenth end portion in the second direction.

7. The semiconductor substrate according to claim 6, wherein
the first opening overlaps the first oxide semiconductor layer and the second oxide semiconductor layer, and
the second opening overlaps the first oxide semiconductor layer and the second oxide semiconductor layer.

8. A display device, comprising:
a semiconductor substrate that includes a first base, a scanning line that is provided on the first base and extends in a first direction, a first insulating layer that is provided on the scanning line, an oxide semiconductor layer that is provided on the scanning line, a second insulating layer that is provided on the oxide semiconductor layer, a first opening and a second opening that are provided in the second insulating layer, a signal line that is provided on the second insulating layer and extends in a second direction intersecting the first direction, a connection electrode that is provided on the second insulating layer and extends in the second direction, and a pixel electrode that is connected to the connection electrode;
a counter-substrate that includes a second base opposed to the pixel electrode, and a counter-electrode located between the second base and the pixel electrode and opposed to the pixel electrode; and
a display function layer which is located between the pixel electrode and the counter- electrode and to which a voltage applied between the pixel electrode and the counter-electrode is applied, wherein
the signal line is connected to the oxide semiconductor layer via the first opening,
the connection electrode is connected to the oxide semiconductor layer via the second opening,
the oxide semiconductor layer has a first end portion and a second end portion extending in the second direction,
the first opening has a third end portion and a fourth end portion extending in the second direction,
the second opening has a fifth end portion and a sixth end portion extending in the second direction,
the third end portion and the fifth end portion are opposed to each other and spaced apart from each other in the first direction,
the first end portion is located between the third end portion and the fourth end portion in the first direction, and
the second end portion is located between the fifth end portion and the sixth end portion in the first direction.

9. The display device according to claim 8, wherein
the signal line has a seventh end portion that extends in the second direction,
the connection electrode has an eighth end portion that extends in the second direction and is opposed to the seventh end portion,
the third end portion is located between the first end portion and the seventh end portion in the first direction, and
the fifth end portion is located between the second end portion and the eighth end portion in the first direction.

10. The display device according to claim 8, wherein
the oxide semiconductor layer includes a first oxide semiconductor layer and a second oxide semiconductor layer,
the second oxide semiconductor layer is disposed spaced apart from the first oxide semiconductor layer in the second direction,
the first oxide semiconductor layer has a ninth end portion and a tenth end portion extending along the first direction,
the second oxide semiconductor layer has an eleventh end portion and a twelfth end portion extending along the first direction,
the first opening has a thirteenth end portion and a fourteenth end portion extending along the first direction,
the second opening has a fifteenth end portion and a sixteenth end portion extending along the first direction,
the tenth end portion and the twelfth end portion are opposed to each other and spaced apart from each other in the second direction,
the ninth end portion is located between the tenth end portion and the thirteenth end portion and between the tenth end portion and the fifteenth end portion in the second direction, and
the eleventh end portion is located between the twelfth end portion and the fourteenth end portion and between the twelfth end portion and the sixteenth end portion in the second direction.

11. The display device according to claim 10, wherein
the first opening overlaps the first oxide semiconductor layer and the second oxide semiconductor layer, and
the second opening overlaps the first oxide semiconductor layer and the second oxide semiconductor layer.

* * * * *